United States Patent [19]
Casper

[11] Patent Number: 5,870,338
[45] Date of Patent: Feb. 9, 1999

[54] CIRCUIT AND METHOD FOR READING AND WRITING DATA IN A MEMORY DEVICE

[75] Inventor: Stephen L. Casper, Boise, Id.

[73] Assignee: Micron Technology, Inc., Boise, Id.

[21] Appl. No.: 858,520

[22] Filed: May 19, 1997

[51] Int. Cl.⁶ .................................................. H03K 17/08
[52] U.S. Cl. .............................. 365/189.01; 365/230.06; 365/189.11; 365/189.05
[58] Field of Search .................... 365/230.01, 189.01, 365/189.09, 230.06, 189.11, 189.05

[56] References Cited

U.S. PATENT DOCUMENTS

| | | | |
|---|---|---|---|
| 5,274,276 | 12/1993 | Casper et al. | 307/443 |
| 5,331,593 | 7/1994 | Merritt et al. | 365/189.11 |
| 5,535,167 | 7/1996 | Hazani | 365/218 |
| 5,555,215 | 9/1996 | Nakagome et al. | 365/226 |
| 5,644,548 | 7/1997 | Kitsukawa et al. | 365/230.06 |

*Primary Examiner*—Viet Q. Nguyen
*Attorney, Agent, or Firm*—Schwegman, Lundberg, Woessner & Kluth, P.A.

[57] ABSTRACT

A memory device. The memory device includes an array of memory cells that are coupled to a number of word lines and a number of digit lines. The memory device further includes an addressing circuit that is coupled to the array. The addressing circuit selects a memory cell based on a received address signal. An input/output device is coupled to the digit lines of the array. The input/output device includes an input for receiving a control signal. A control circuit is coupled to the input of the input/output device. The control circuit produces a control signal with a first voltage level when reading data from the array and produces a control signal with a second voltage level when writing data to the array. Thus, the control signal causes the input/output device to provide acceptable drive current during a read operation such that the input/output device does not disturb the data on the digit lines. Further, the control signal provides sufficient drive current during a write operation to allow the data on input/output lines to be passed to the digit lines.

20 Claims, 4 Drawing Sheets

CIRCUIT AND METHOD FOR READING AND WRITING DATA IN A MEMORY DEVICE

TECHNICAL FIELD OF THE INVENTION

The present invention relates generally to the field of electronic circuits and, in particular, to a circuit and method for reading and writing data in a memory device.

BACKGROUND OF THE INVENTION

Electronic systems typically store data during operation in a memory device. In recent years, the dynamic random access memory (DRAM) has become a popular data storage device for such systems. Basically, a DRAM is an integrated circuit that stores data in binary form (e.g., "1" or "0") in a large number of cells. The data is stored in a cell as a charge on a capacitor located within the cell. Typically, the cells of a DRAM are arranged in an array so that individual cells can be addressed and accessed. The array can be thought of as rows and columns of cells. Each row includes a word line that interconnects all of the cells on the row with a common control signal. Similarly, each column includes a digit line that is coupled to at most one cell in each row. Thus, the word and digit lines can be controlled so as to individually access each cell of the array.

To read data out of a cell, the capacitor of a cell is accessed by selecting the word line associated with the cell. A complimentary digit line that is paired with the digit line for the selected cell is equilibrated with the voltage on the digit line for the selected cell. When the word line is activated for the selected cell, the capacitor of the selected cell discharges the stored voltage onto the digit line, thus changing the voltage on the digit line. A sense amplifier detects and amplifies the difference in voltage on the pair of digit lines. An input/output device for the array, typically an n-channel transistor, passes the voltage on the digit line for the selected cell to an input/output line for communication to, for example, a processor of a computer or other electronic system associated with the DRAM. In a write operation, data is passed from the input/output lines to the digit lines by the input/output device of the array for storage on the capacitor in the selected cell.

One problem with DRAM design relates to sizing of the input/output devices of the memory array. Typically, the input/output devices are n-channel transistors that are two to eight times smaller than the transistors in the sense amplifier. The ratio of transistor sizes used in a specific design results from trade-offs that relate to the two distinct operations of the input/output device, namely reading and writing data. During a read operation, the input/output device should not affect the voltage on the digit lines. If the input/output devices are too big (e.g., provide too small of a resistance between the sense amplifier and the input/output lines), the input/output devices can trigger the parasitic capacitance of the input/output lines or imbalances in the layout of the sense amplifier such that the data on the digit lines is corrupted. Conversely, during a write operation, the input/output devices need to be able to trigger the sense amplifier to move the voltage on the digit lines to the power supply voltage and ground potential. If the input/output devices of the array are too small, the devices will not provide sufficient current for triggering the sense amplifier when data is to be written to a selected cell over the digit line. Thus, conventional designs require a trade-off with respect to sizing the input/output devices of the memory array.

For the reasons stated above, and for other reasons stated below which will become apparent to those skilled in the art upon reading and understanding the present specification, there is a need in the art for an improved circuit and method for reading and writing data in an array of a memory device.

SUMMARY OF THE INVENTION

The above mentioned problems with memory devices and other problems are addressed by the present invention and which will be understood by reading and studying the following specification. A memory device is described which uses an input/output device for the array that operates with different drive levels for different access states. For purposes of this specification, one access state is the state of reading data from a memory cell. Another state is the state of writing data to a memory cell.

In particular, an illustrative embodiment of the present invention includes a method for writing and reading data in a memory device. According to this embodiment the method applies a control signal with a first voltage level to an input/output device of the memory array when reading data from the memory device. The method further applies a control signal with a second voltage level, different from the first voltage level, to the input/output device of the memory array when writing data in the memory device. Specifically, in one embodiment, the voltage level of the control signal is higher during a write operation. By using different voltages on the control signal during different states of an access, the control signal causes the input/output device to provide acceptable drive current during a read operation such that the input/output device does not disturb the data on a pair of digit lines for the cell. Further, the control signal provides sufficient drive current during a write operation to allow the data on input/output lines to be passed to the digit lines.

In another embodiment, the present invention provides a method of writing and reading data in a memory device. According to this embodiment, the method selects a cell of an array of the memory device to be accessed and charges a word line for the selected cell. The method further activates a sense amplifier associated with the charged word line. The method selectively drives an input/output device of the array with different current levels during different states of an access operation. In one embodiment, the method selectively drives an n-channel transistor with different voltage levels during read and write operations.

In another embodiment, the present invention provides a memory device. The memory device includes an array of memory cells that are coupled to a number of word lines and a number of digit lines. The memory device further includes an addressing circuit that is coupled to the array. The addressing circuit selects a memory cell based on a received address signal. An input/output device is coupled to the digit lines of the array. The input/output device includes an input for receiving a control signal. A control circuit is coupled to the input of the input/output device. The control circuit produces a control signal with a first voltage level when reading data from the array and produces a control signal with a second voltage level when writing data to the array.

In another embodiment, the present invention provides a method of accessing a selected cell of a memory device. The method determines the address of the selected cell and activates a sense amplifier that is coupled to control the voltage on a pair of digit lines for the selected cell of the memory device. The method further determines the type of access, e.g., read or write, to be executed for the selected cell of the memory device. Based on the determination, the method generates a variable voltage control signal to activate input/output transistors of the memory array so as to couple data between the digit lines and a pair of complementary input/output lines.

In another embodiment, the present invention provides a memory device. The memory device includes an array of addressable memory cells that are coupled to digit and word lines. An address circuit selects a cell in the array. The memory device also includes a sense amplifier that is coupled to control the voltage on a pair of digit lines for the selected cell of the memory device. The memory device includes input/output transistors that couple the pair of digit lines to a pair of input/output lines. A control circuit of the memory device determines the type of access to be executed for the selected cell of the memory device and generates a variable voltage control signal to activate the input/output transistors of the memory array based on the type of access so as to couple data between the digit lines and the input/output lines.

In another embodiment, the present invention provides a memory device for storing data. The memory device includes a control circuit that produces signals to control the operation of the memory device. An array of cells of the memory device are accessed by a number of word and digit lines. The memory device also includes a number of input/output lines. Further, a number of input/output devices are driven by a variable voltage control signal from the control circuit to couple data between the input/output lines and a selected cell via the digit lines depending on a state of the access.

DETAILED DESCRIPTION OF THE INVENTION

In the following detailed description of the invention, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
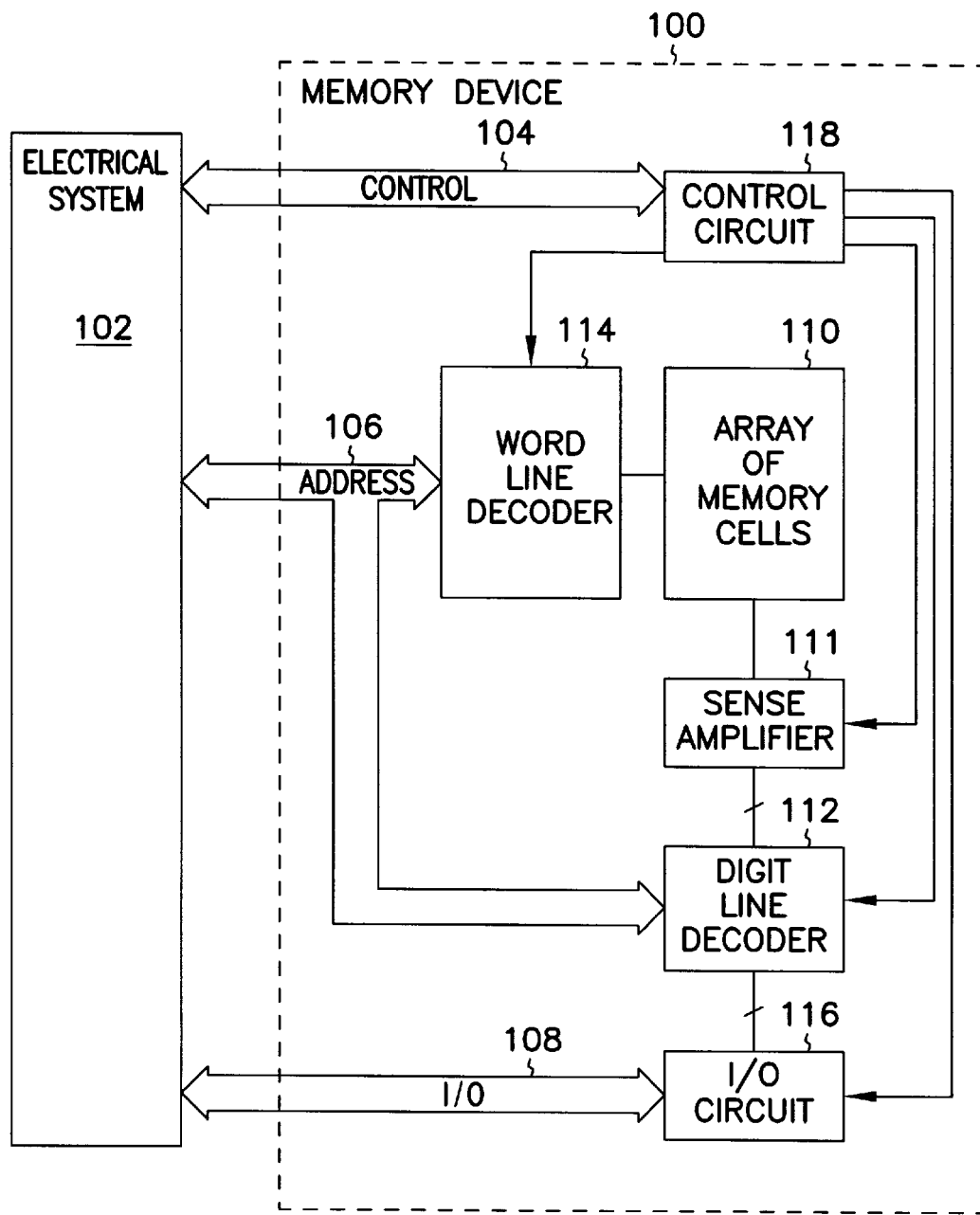
FIG. 1 is a block diagram of an illustrative embodiment of the present invention.

FIG. 1 is a block diagram of an illustrative embodiment of the present invention. This embodiment includes memory device 100 that is coupled to electronic system 102 by control lines 104, address lines 106 and input/output (I/O) lines 108. Electronic system 102 comprises, for example, a processor based computer, or other appropriate system for reading and writing data in a memory device. Memory device 100 includes array of memory cells 110 that is coupled to word line decoder 114 and sense amplifier 111. Word line decoder 114 includes word line drivers that are coupled to word lines of array 110. Sense amplifier 111 is coupled to digit line decoder 112. Digit line decoder 112 and word line decoder 114 are coupled to address lines 106. Digit line decoder 112 is coupled to I/O circuit 116. I/O circuit 116 is coupled to I/O lines 108. Control circuit 118 is coupled to control lines 104, sense amplifier 111, word line decoder 114, digit line decoder 112, and I/O circuit 116.

In operation, electronic system 102 provides signals on address lines 106 and control lines 104 when data is to be read from or written to a cell of array 110. Word line decoder 114 determines the word line of a selected cell of array 110 using the address provided on address lines 106. Further, digit line decoder 112 determines the digit line of the selected cell of array 110. In a read operation, sense amplifier 112 detects the value stored in the selected cell based on word lines of array 110. Sense amplifier provides this voltage to I/O circuit 116 which, in turn, passes data to electronic system 102 over I/O lines 108. In a write operation, I/O circuit 116 passes data from I/O lines 108 to sense amplifier 112 for storage in the selected cell of array 110.

Control circuit 118 of this embodiment advantageously uses different voltage levels for control signals provided to column input/output (I/O) devices of sense amplifier 112 during read and write operations. Specifically, during a read operation, control circuit 118 provides a control signal with a first voltage level to the column I/O devices of sense amplifier 112. During a write operation, control circuit 118 uses a second, higher voltage level for the control signal to column I/O devices of sense amplifier 112. For example, control circuit 118 could provide a voltage on the order of the power supply as a control signal during a read operation and a pumped voltage (e.g., above the power supply voltage) during a write operation.

Figure 2:
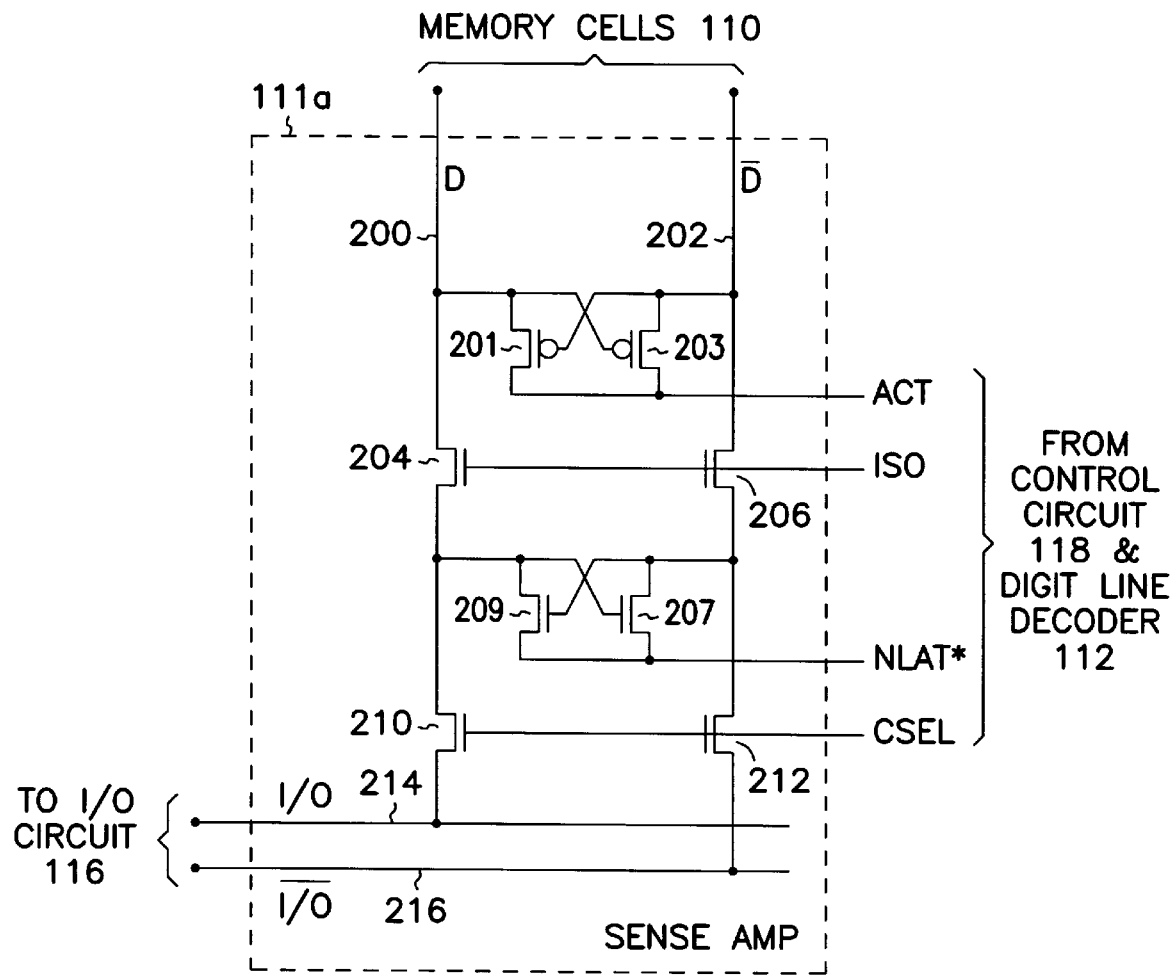
FIG. 2 is a schematic diagram of an embodiment of a sense amplifier circuit for use in a memory device according to the teachings of the present invention.

FIG. 2 is a schematic diagram of an embodiment of a sense amplifier, indicated generally at 111a, constructed according to the teachings of the present invention. Sense amplifier 111a includes first and second p-channel transistors, 201 and 203, respectively. Transistors 201 and 203 are coupled between digit (D) and digit complement ($\overline{D}$) lines 200 and 202, respectively, in a cross-coupled configuration to form a p-sense amplifier. The p-sense amplifier is controlled by a signal, labeled ACT, that is provided to the gate of transistors 201 and 203. Digit and digit complement lines 200 and 202 are coupled to, for example, array 110 of FIG. 1. Further, sense amplifier 111a includes isolation transistors 204 and 206 that are coupled to digit and digit complement lines 200 and 202, respectively. Isolation transistors 204 and 206 are also coupled to first and second n-type transistors 207 and 209 in a cross-coupled configuration as shown in FIG. 1. Transistors 207 and 209 form an n-sense amplifier that works in cooperation with the p-sense amplifier to drive the voltage on digit and digit complement lines 200 and 202 to the power supply voltage and ground. Sense amplifier 111a also includes first and second input/output (I/O) transistors 210 and 212 that couple digit and digit complement lines 200 and 202 to I/O and I/O complement lines 214 and 216, respectively. Transistors 210 and 212 are commonly referred to as column I/O transistors or devices Sense amplifier 111a receives control signals from, for example, control circuit 118 and digit line decoder 112 of FIG. 1. A signal, labeled ISO, is coupled to the gates of isolation transistors 204 and 206. Additionally, a gate of each of I/O transistors 210 and 212 is coupled to receive a control signal, labeled CSEL. A latch signal, labeled NLAT*, is coupled to a gate of transistors 207 and 209.

In operation, sense amplifier 111a passes data between, for example, electronic system 102 and array of memory cells 110 of FIG. 1. The operation of sense amplifier 111a is described using the example of reading a high logic level from digit line 200 and then writing a low logic level to the selected cell on digit line 200. FIGS. 3A through 3I provide exemplary timing diagrams that illustrate voltage levels of various signals of sense amplifier 111a of FIG. 2 during this operation.

At time $t_1$, a control signal labeled $\overline{RAS}$ (Row Address Strobe) transitions from a high voltage level to a low voltage level. This indicates that an address of a row (e.g., word line) in array 110 for a selected cell is available on address lines 106. Word line decoder 114 determines the word line for the selected cell of array 110. At time $t_2$, the word line for the selected cell is raised to a high voltage level (typically, a voltage level above the power supply voltage). With the word line at a high voltage level, the selected cell dumps charge onto digit line 200 as shown after time $t_2$ in FIG. 3F. At this point the control signal ISO is at a high voltage level such that the voltage on digit line 200 is passed to transistors 207 and 209 of the n-sense amplifier.

Figure 3A:
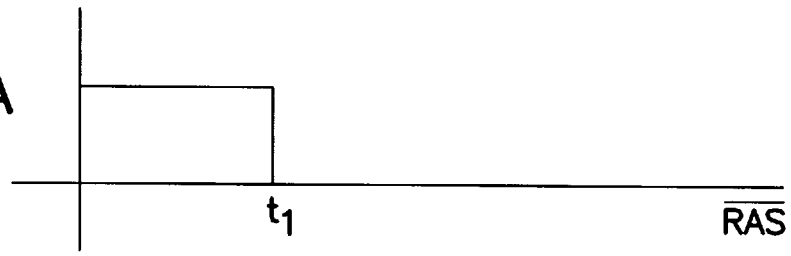
FIGS. 3A through 3I are timing diagrams that illustrate signals for use with, for example, the embodiments of FIGS. 1 and 2 according to the teachings of the present invention.
Figure 3B:
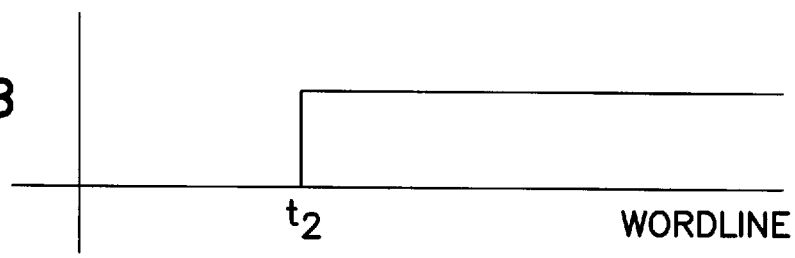
Figure 3C:
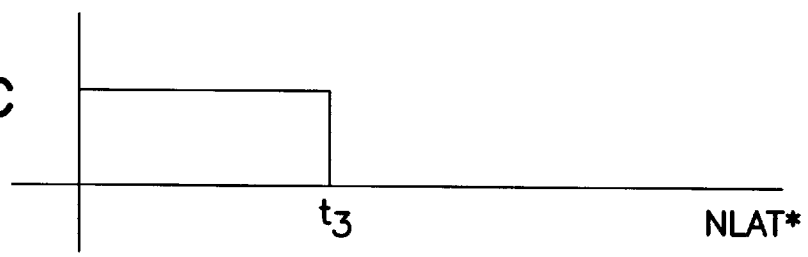
Figure 3D:
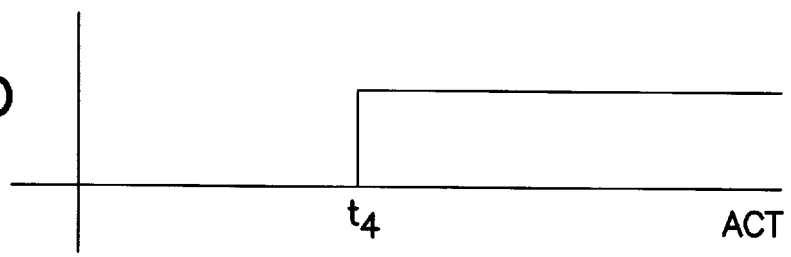
Figure 3E:
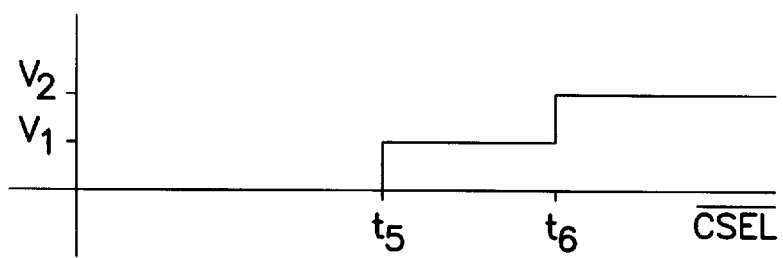
Figure 3F:
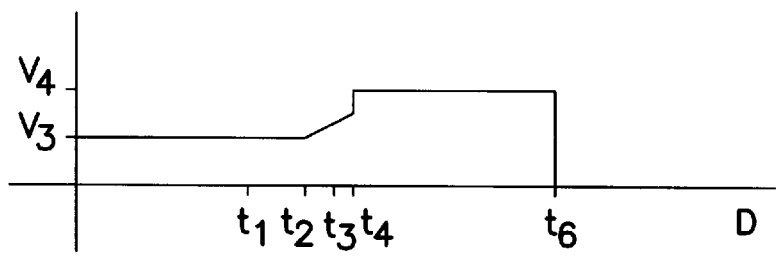
Figure 3G:
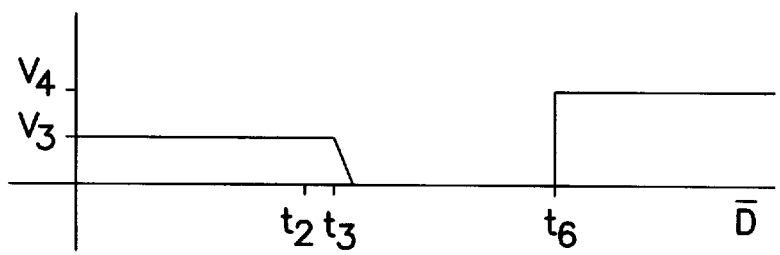
Figure 3H:
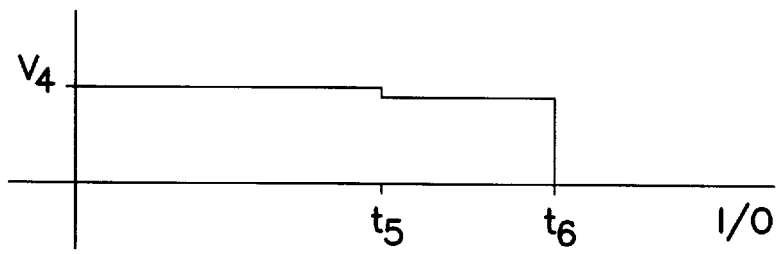
Figure 3I:
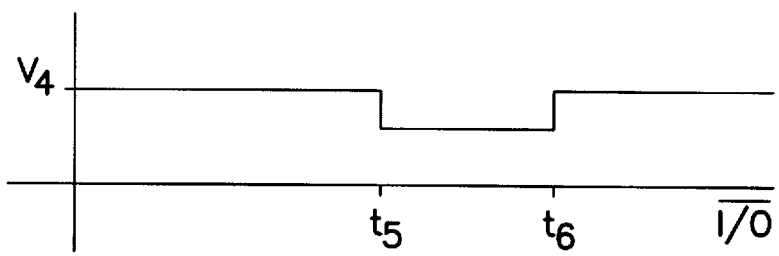

At time $t_3$, NLAT* is brought to a low voltage level. This activates the n-sense amplifier to drive the low potential digit line to ground. In this case, FIG. 3G shows that the voltage on digit complement line 202 is driven to ground by transistors 207 and 209. At time $t_4$, the ACT signal is brought to a high potential so as to activate transistors 201 and 203 of the p-sense amplifier to drive the higher potential digit line (digit line 200) to, for example, approximately the value of the power supply voltage as shown in FIG. 3F.

At time $t_5$, the CSEL signal transitions to a voltage level, $V_1$. This voltage level provides acceptable drive current for I/O transistors 210 and 212 to cause a separation in the voltage level on I/O and I/O complement lines 214 and 216 that indicates to electronic system 102 that a high logic value is stored in the selected cell. At time $t_6$, a low logic value is placed on I/O line 214 for storage in the selected cell. At $t_6$, the CSEL signal is raised to a higher voltage level, $V_2$, so that I/O transistors 210 and 212 provide higher drive current so as to cause sense amplifier 111a to drive digit and digit complement lines 200 and 202 to appropriate levels to store the data provided on I/O and I/O complement lines 214 and 216.

Advantageously, different voltage levels are used to drive I/O and I/O complement transistors 210 and 212 during the read and write operations to reduce negative effects of I/O line capacitance and parasitic imbalances of sense amplifier 208 during read operations. During a read operation, a lower voltage, $V_1$, is used. This produces a reduced drive current (alternatively, increases the effective resistance of the transistor). The increased resistance alters the time constant for the parasitic capacitances so as to assure that the sense amplifier has sufficient time to drive the digit and digit complement lines to the correct values before the I/O lines can interfere. A higher voltage is used during a write operation because the goal is to have the voltage on the I/O lines affect the voltage of the sense amplifier. The higher gate voltage increases the drive current (reduces the resistance) so that the sense amplifier responds to the value of the voltage on the I/O and I/O complement lines. This also allows a higher voltage (e.g., a voltage above the power supply voltage) to be passed to the sense amplifier by transistors 210 and 212.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the type of sense amplifier used with the memory device can be altered without departing from the spirit and scope of the present invention. Further, the order and timing of the various control signals used during the read and write operations can be varied from what is shown in FIGS. 3A through 3I.

What is claimed is:

1. A method for writing and reading data in a memory device, the method comprising the steps of:

applying a control signal with a first voltage level to an input/output device of the memory array when reading data from the memory device; and applying a control signal with a second voltage level, different from the first voltage level, to the input/output device of the memory array when writing data in the memory device.

2. The method of claim 1, wherein the step of applying a control signal with a first voltage level comprises the step of applying a control signal with a voltage level that is lower than the second voltage level.

3. A method of writing and reading data in a memory device, the method comprising the steps of:

selecting a cell of an array of the memory device to be accessed;

charging a word line for the selected cell;

activating a sense amplifier associated with the charged word line; and selectively driving an input/output device of the array with different current levels during different states of an access operation.

4. The method of claim 3, wherein the step of selectively driving an input/output device with different current levels comprises the step of selectively driving an input/output device with different current levels during read and write operations.

5. The method of claim 3, wherein the step of selectively driving an input/output device comprises the step of driving an n-channel transistor with different voltage levels during read and write operations.

6. The method of claim 3, wherein the step of selectively driving the input/output device comprises the steps of:

driving the input/output device with a first voltage level during a read operation; and driving the input/output device with a second, higher voltage level during a write operation.

7. A memory device, comprising:

an array of memory cells that are coupled to a number of word lines and a number of digit lines;

an addressing circuit, coupled to the array, that selects a memory cell based on a received address signal;

an input/output device coupled to the digit lines of the array and having an input for receiving a control signal; and a control circuit, coupled to the input of the input/output device, that produces a control signal with a first voltage level when reading data from the array and that produces a control signal with a second voltage level when writing data to the array.

8. The memory device of claim 7, wherein the control circuit produces a control signal with a voltage level during a read operation that is lower than the voltage level of the control signal during a write operation.

9. The memory device of claim 7, wherein the input/output device comprises an n-channel transistor.

10. A system, comprising:
a processor circuit;
a memory device coupled to the processor circuit for writing and reading data, the memory device including:
an array of cells that are accessed by a number of word and digit lines based on signals from the processor;
a number of input/output lines that are communicatively coupled to the processor; and
a number of input/output devices that are driven by a variable voltage control signal to couple data between the input/output lines and the digit lines depending on a state of the access.

11. The system of claim 10, wherein the memory device includes a control circuit that generates the variable voltage control signal with a first voltage level during a read state of the access and a second, different voltage level during a write state of the access.

12. The system of claim 10, wherein the memory device includes a control circuit that adjusts the variable voltage control signal with a first voltage level during a read operation and a second, higher voltage level during a write operation.

13. A method of accessing a selected cell of a memory device, the method comprising the steps of:
determining the address of the selected cell;
activating a sense amplifier that is coupled to control the voltage on a pair of digit lines for the selected cell of the memory device;
determining a type of access to be executed for the selected cell of the memory device; and
generating a variable voltage control signal to activate input/output transistors of the memory array based on the type of access so as to couple data between the digit lines and a pair of complementary input/output lines.

14. The method of claim 13, wherein the step of generating a variable voltage control signal comprises the steps of:
generating a control signal with a first voltage level during a read portion of an access; and
generating a control signal with a second voltage level during a write portion of an access.

15. The method of claim 13, wherein the step of generating a variable voltage control signal comprises the steps of:
generating a control signal with a first voltage level during a read portion of an access; and
generating a control signal with a second, higher voltage level during a write portion of an access.

16. A memory device, comprising:
an array of addressable memory cells that are coupled to digit and word lines;
an address circuit that selects a cell in the array;
a sense amplifier that is coupled to control the voltage on a pair of digit lines for the selected cell of the memory device;
input/output transistors that couple the pair of digit lines to a pair of input/output lines; and
a control circuit that determines a type of access to be executed for the selected cell of the memory device and that generates a variable voltage control signal to activate the input/output transistors of the memory array based on the type of access so as to couple data between the digit lines and the input/output lines.

17. The memory device of claim 16, wherein the input/output transistors comprise n-channel transistors.

18. The memory device of claim 16, wherein the sense amplifier comprises an pair of cross-coupled n-channel transistors.

19. A memory device for writing and reading data, the memory device comprising:
a control circuit that produces signals to control the operation of the memory device;
an array of cells that are accessed by a number of word and digit lines;
a number of input/output lines; and
a number of input/output devices that are driven by a variable voltage control signal from the control circuit to couple data between the input/output lines and a selected cell via the digit lines depending on a state of the access.

20. The memory array of claim 19, wherein the control circuit produces the variable control signal with a first voltage level during a read operation and with a different, higher voltage level during a write operation.

* * * * *